United States Patent [19]
Ohkoda et al.

[11] Patent Number: 5,395,782
[45] Date of Patent: Mar. 7, 1995

[54] PROCESS FOR FABRICATING A SEMICONDUCTOR INTEGRATED CIRCUIT

[75] Inventors: Toshiyuki Ohkoda, Ohizumi; Satoru Kaneko, Kumagaya, both of Japan

[73] Assignee: Sanyo Electric Co., Ltd., Osaka, Japan

[21] Appl. No.: 922,065

[22] Filed: Jul. 29, 1992

[30] Foreign Application Priority Data

Jul. 29, 1991 [JP] Japan ................ 3-188859

[51] Int. Cl.$^6$ .................... H01L 21/28; H01L 21/62
[52] U.S. Cl. ........................................ 437/47; 437/60
[58] Field of Search .................... 437/47, 60, 919

[56] References Cited

U.S. PATENT DOCUMENTS

| | | | |
|---|---|---|---|
| 4,441,249 | 4/1984 | Alspector et al. | 437/60 |
| 4,997,794 | 3/1991 | Josquin et al. | 437/60 |
| 5,075,296 | 12/1991 | Re et al. | 437/47 |
| 5,108,941 | 4/1992 | Paterson et al. | 437/47 |

FOREIGN PATENT DOCUMENTS

58-46666  3/1983  Japan ................ 437/60

*Primary Examiner*—George Fourson
*Attorney, Agent, or Firm*—Vineet Kohli; Thomas R. Morrison

[57] ABSTRACT

A LOCOS film is formed on the surface of an epitaxial layer. A gate electrode is formed on the epitaxial layer. At the same time that the gate electrode is formed, a lower electrode is formed on the LOCOS film. A diffusion region is formed on each element and then covered with a BPSG film. A contact hole and capacitor exposure are formed in a capacitor element simultaneously. A film of SiN is deposited in layers over the capacitor exposure. The film of SiN covers undesired areas about the capacitor exposure. Excess SiN film outside the desired area over the capacitor exposure is removed by masking and etching to leave the remaining film area over the capacitor exposure to serve as a capacitor dielectric film. Finally, an Al upper electrode is formed over the SiN film to serve as electrode wiring. The process reduces the series resistance of the capacitor element, thereby reducing power required for charging the dielectric, and speeding the charging process. The low resistance eliminates parasitic leakage currents and the formation of parasitic capacitances.

8 Claims, 4 Drawing Sheets

PROCESS FOR FABRICATING A SEMICONDUCTOR INTEGRATED CIRCUIT

BACKGROUND OF THE INVENTION

This invention relates to a process for fabricating a semiconductor integrated circuit and, more particularly, to a process for fabricating a semiconductor integrated circuit whereby a capacitor element may be formed thereon.

There are two kinds of capacitor elements in an integrated circuit. One is referred to as a junction capacitor element. It makes use of a P-N junction. The other is referred to as a metal-oxide semiconductor (MOS) capacitor element. It uses a dielectric substance. The MOS capacitor element has a larger capacitance per unit area than the P-N junction capacitor element.

An example of a MOS capacitor element is disclosed in FIG. 8 of Japanese Laid-open Patent Publication No. 59-28368. A p-type semiconductor substrate 1 is shown with an n-type epitaxial layer 2 and an n+-type buried layer 3 therein. P+-type isolation regions 4 separate an island region 5 from epitaxial layers 2. Island region 5 is shown sandwiched between buried layer 3 and an n+-type first region 6 formed on the surface of island region 5. An oxide film 7 coats the surface of the device. A first electrode 8 and a second electrode 9 form ohmic contacts within n+-type first region 6. Dielectric film 10, a very thin oxide film, is formed between first region 6 and second electrode 9 immediately after removing an oxide film 7 completely therefrom. The capacitance between first region 6 and second electrode 9 is the basis of the capacitance within the MOS capacitor element.

Recently, a process for fabricating semiconductor integrated circuits has been developed whereby a bipolar element and a MOS element may be combined forming a bipolar-complementary MOS, hereinafter called Bi-CMOS. However, this process falls short of being able to attach a capacitor element to the Bi-CMOS technology, as mentioned above.

OBJECT AND SUMMARY OF THE INVENTION

An object of the present invention is to provide a process for fabricating a semiconductor integrated circuit, and, more particularly, to provide a process for fabricating a semiconductor integrated circuit having a capacitor element that can be easily put into a Bi-CMOS integrated circuit.

Briefly stated, the present invention provides the process for fabricating a semiconductor integrated circuit having a capacitor element. The process comprises the steps of: forming a lower electrode on a local oxidation-of-silicon (LOCOS) film formed on a semiconductor integrated circuit, coating the surface with a boron phosphorous silicate glass film (BPSG), forming both a contact hole to join elements and an opening to form a capacitor element simultaneously, forming a dielectric film in layers on the whole surface, forming a resist mask to coat the above-mentioned opening, removing the dielectric film on the BPSG film and in the contact hole so that dielectric film remains only on the opening and forming a contact to make an electrical connection to the lower electrode and the upper electrode using an electrode wiring material.

The above-described process allows several features not available in the prior art. Both a contact hole and an opening of a capacitor element may be formed simultaneously resulting in fewer steps to be carried out in the fabrication process. The dielectric film of the capacitor element may be patterned more effectively. This results in greater accuracy in the capacitance resulting from the fabrication process of the capacitor element. Also, the dielectric film formed in layers within the contact hole is removable using a photo etching process which must be performed only once. Therefore both photo etching of BPSG film 29 and dielectric film 34 is done just once to each respectively resulting in fewer steps to be carried out, thereby increasing the efficiency of the fabrication process.

According to an embodiment of the invention, there is provided a process for fabricating a semiconductor integrated circuit, comprising: forming an oxide film area on a semiconductor substrate through the local oxidation of silicon (LOCOS), the step of forming an oxide film including isolating each of a plurality of elements of the circuit, forming a gate electrode on a first element, forming a lower electrode of a capacitor element on a second element, coating an oxide film on the gate electrode and the lower electrode, forming simultaneously a contact hole to expose a surface of a diffusion region of each element and a surface of the lower electrode and an opening to expose a substantial part of a surface of the lower electrode, forming a thin film dielectric in layers on each surface of the circuit, coating a resist pattern over the opening of the lower electrode, removing the thin film dielectric from the contact hole, coating an electrode material on each surface of the circuit, forming an upper electrode upon a portion of the dielectric thin film, forming an electrode contacting with the lower electrode through the contact hole, and forming an electrode contacting each of the diffusion regions.

The above, and other objects, features and advantages of the present invention will become apparent from the following description in conjunction with the accompanying drawings, in which like reference numerals designate the same elements.

DETAILED DESCRIPTION OF THE PREFERRED EMBODIMENTS

The process for fabricating a semiconductor integrated circuit of the present invention will be explained in conjunction with the accompanying drawings.

Figure 1:
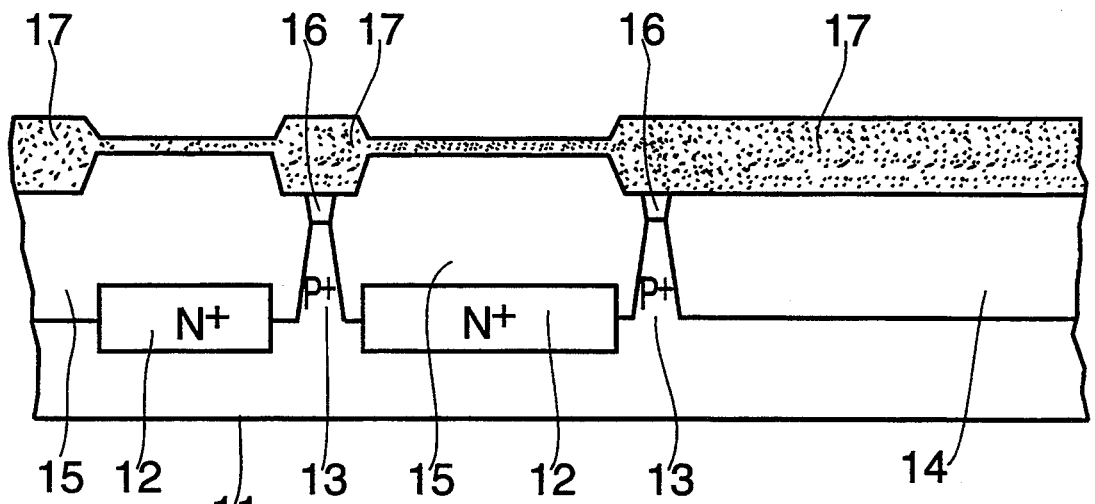
FIG. 1 is a sectional view of the semiconductor device formed using a process step defined in the present invention.

FIG. 1 shows a basic structure of a semiconductor integrated circuit fabricated through the first steps of the process defined by the present invention.

The initial process is as follows. On the surface of a p-type silicon semiconductor substrate 11 are formed an n+-type buried layer 12 and the lower part of a p+-type isolation region 13. An n-type epitaxial layer 14 is then formed thereon. Next, a p-type impurity is deposited into the surface of n-type epitaxial layer 14 at predetermined locations, thereby forming isolation regions 16. Isolation regions 16 separate n-type epitaxial layer 14 into island regions 15. The surface of epitaxial layer 14 is selectively oxidized, forming a local oxidation of silicon (LOCOS) film 17 having a thickness in the range of 0.8–1.0 microns ($\mu$).

Figure 2:
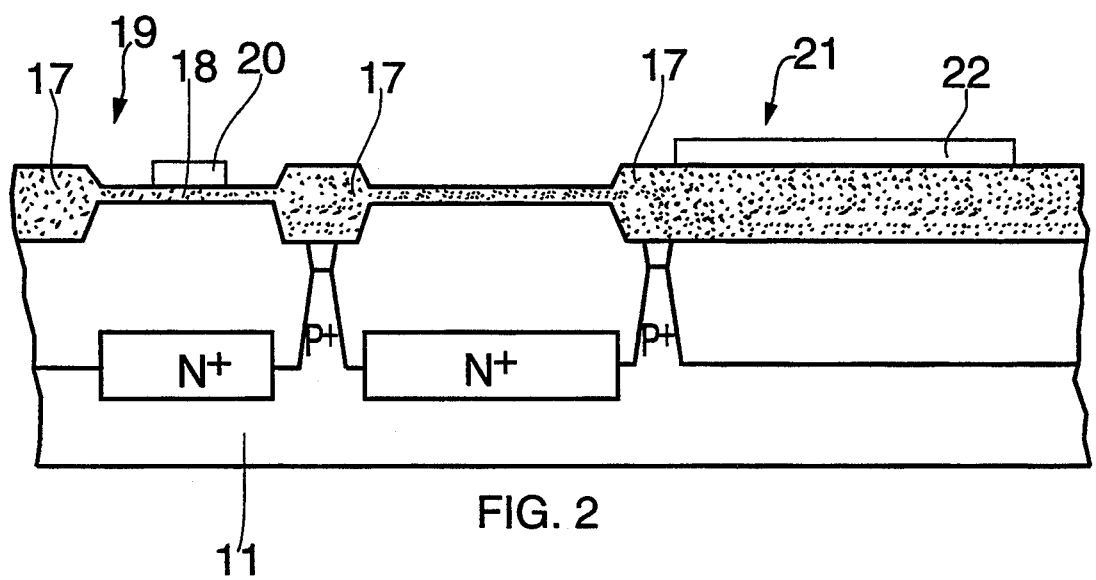
FIG. 2 is a sectional view of the semiconductor device shown in FIG. 1, further transformed using a process step defined in the present invention.

FIG. 2 shows the structure of FIG. 1 further modified by the additional step disclosed below whereby a capacitor element 21 and a MOSFET 19 are formed thereon.

A gate oxide film 18 is formed on the surface of epitaxial island 15 around film 17 by heat oxidation to a thickness in the range of 500–800 Angstroms (Å). A non-doping polysilicon substance in the thickness range of 0.4–0.8 $\mu$ is applied in layers on the whole surface of the gate oxide film 18. Impurities such as phosphorus or the like are doped into the polysilicon layers, thereby defining its electrical conductivity. A process of photo etching defines the surface pattern of the doped polysilicon film, thereby defining the physical dimensions of a gate electrode 20. That area of the semiconductor integrated circuit is now a MOS transistor.

Figure 7:
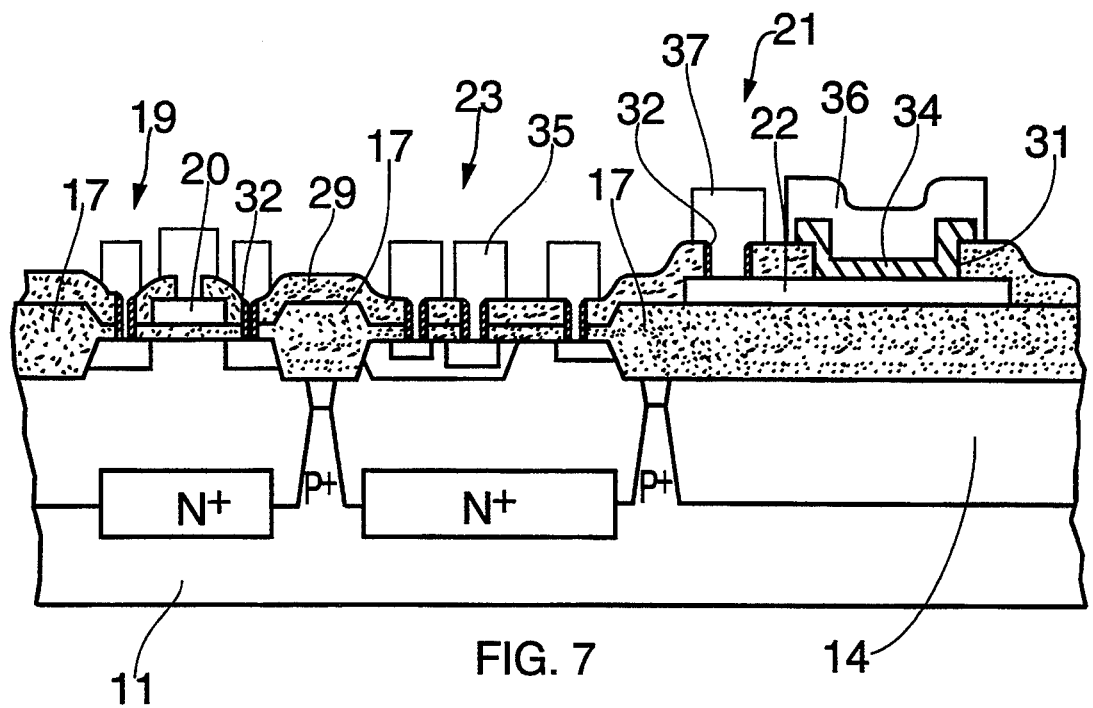
FIG. 7 is a sectional view of the semiconductor device shown in FIG. 6, further transformed using a process step defined in the present invention.
Figure 8:
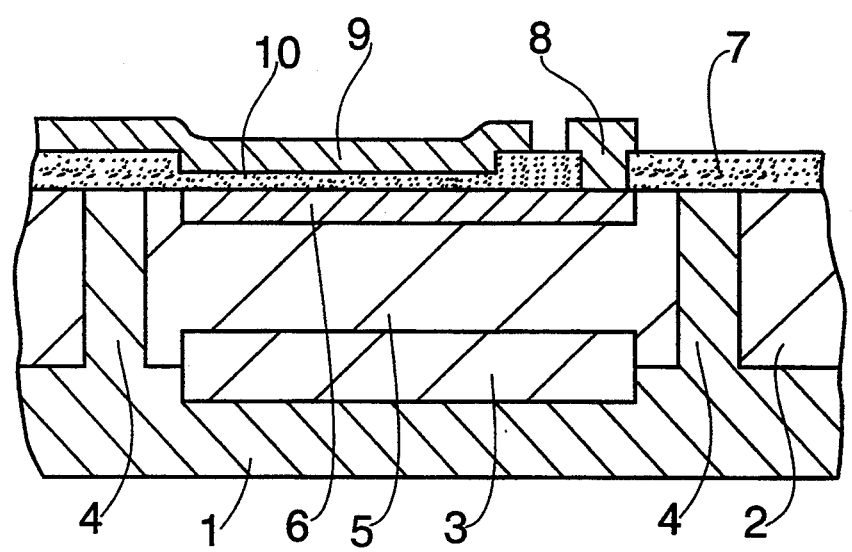
FIG. 8 is a sectional view depicting a semiconductor integrated circuit formed by a process known in the prior art.

A lower electrode 22 (the reason for referring to this electrode as "lower" becoming clear with reference to FIG. 7) may be formed using the above-mentioned non-doping polysilicon application with the above-mentioned doping step. This process is carried out above and proximate to another n-type epitaxial island 15 on film 17, thereby forming a capacitor element 21. The surface dimensions (area of lower electrode 22) define the capacitance of capacitor element 21.

Figure 3:
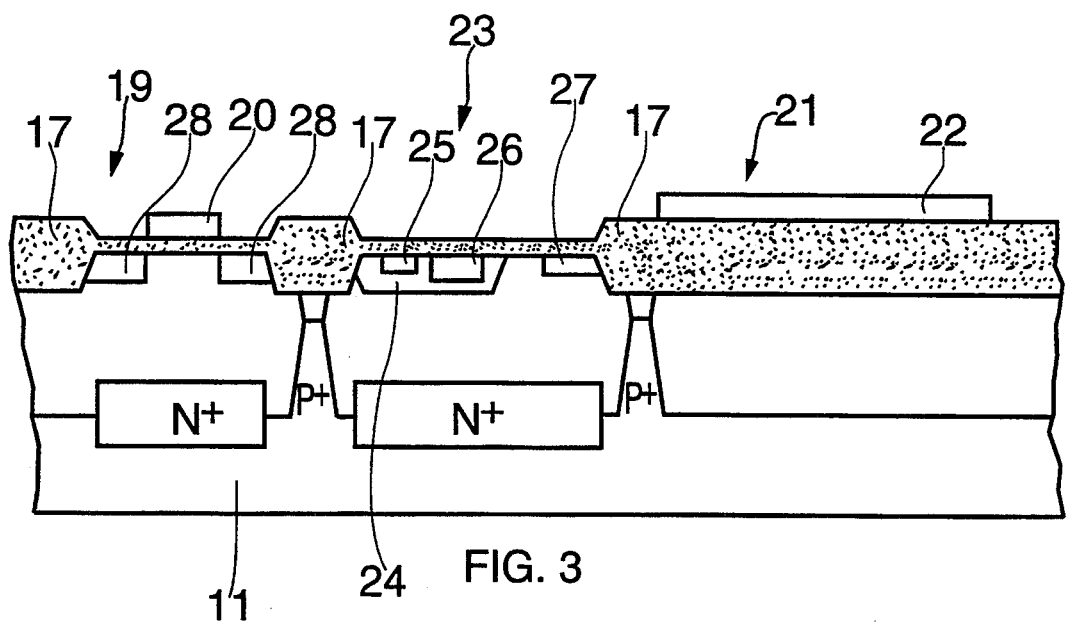
FIG. 3 is a sectional view of the semiconductor device shown in FIG. 2, further transformed using a process step defined in the present invention.

FIG. 3 shows the structure of FIG. 2 further modified by the additional step disclosed below whereby MOSFET 19 is transformed into a p-channel MOS transistor 19' and a bipolar transistor. In particular, an NPN transistor 23 is formed between p-channel MOS transistor 19' and capacitor element 21.

In general, NPN transistors and MOS transistors have a plurality of impurity regions formed using photolithograpy, etching, and ion implantation or diffusion.

NPN transistor 23 is formed on an epitaxial island 15. A p-type region 24 is diffused on epitaxial island 15. A p+-type base contact region and an n+-type emitter region 25 are formed on base region 24. An n+-type collector contact region 27 is diffused in epitaxial island 15.

A P-channel MOS transistor 19 including a p+-type source 28 and a p+-type drain region 28 are diffused on epitaxial island 15, one on either side of a gate electrode 20.

The same diffusion process is used for the simultaneous formation of p+-type source 28 and p+-type drain region 28 of MOS transistor 19, and p+-type base contact region 26 of NPN transistor 23.

In addition to the elements shown, the integrated circuit of the present invention includes an N-channel MOS transistor (not shown in the figures). The N-channel MOS transistor has an n+-type source and an n+-type drain region. The source and drain regions of the N-channel MOS transistor are formed during the diffusion process used to form n+-type emitter region 25 of NPN transistor 23.

Figure 4:
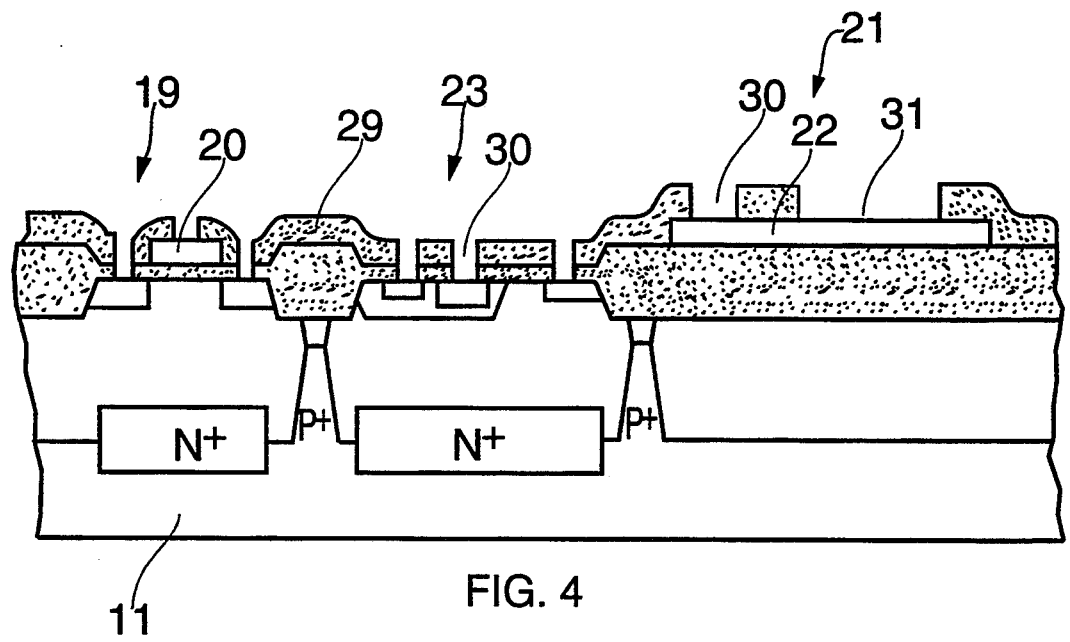
FIG. 4 is a sectional view of the semiconductor device shown in FIG. 3, further transformed using a process step defined in the present invention.

FIG. 4 shows the structure of FIG. 3 further modified by the additional step disclosed below whereby contact holes 30 are formed in a thin film on NPN transistor 23 and lower electrode 22 of capacitor element 21.

A boron phosphorous silicate glass (BPSG) thin film 29 is deposited in a thickness range of 1.0–2.0 $\mu$ on the entire surface of the semiconductor integrated circuit. The BPSG thin film is applied in layers using chemical vapor deposition (CVD) or the like. Contact holes 30 are formed by etching above p+-type source 28 and p+-type drain region 28, the diffusion regions of p-channel MOSFET 19', n+-type emitter region 25, p+-type base contact region 26 and an n+-type collector contact region 27, the diffusion regions of bipolar transistor 23, and above a small portion of lower electrode 22. An exposure 31 for the capacitor is also formed by etching on lower electrode 22, which is separated from the contact hole 30, formed thereon, by an island of BSPG thin film. The etching method may be anisotropic or isotropic. Most of the surface of lower electrode 22 now forms exposure 31, forming the MIS capacitor element.

Figure 5:
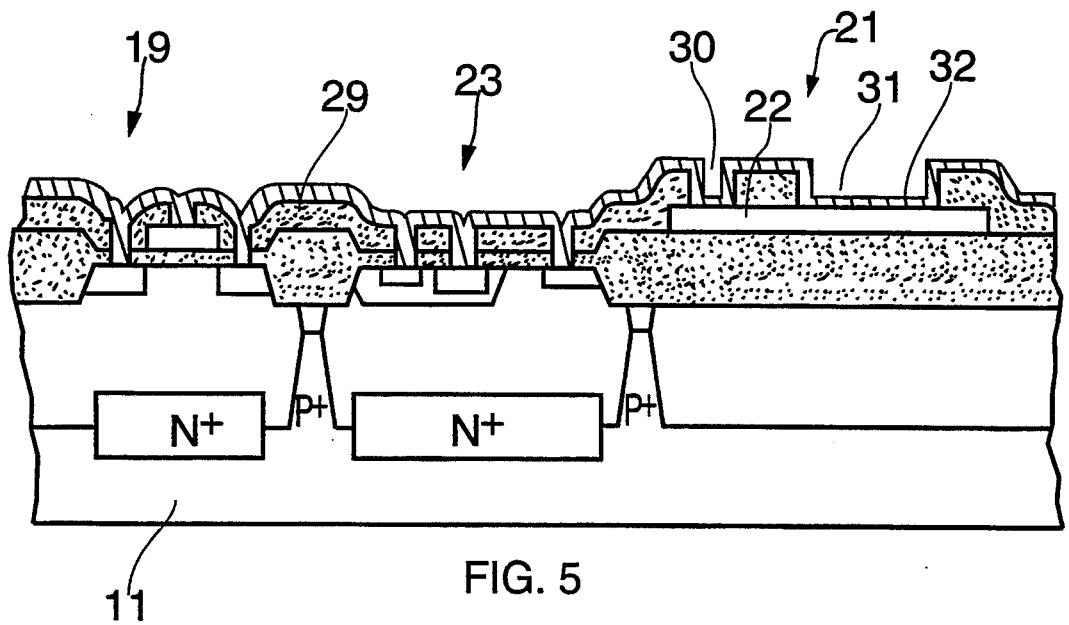
FIG. 5 is a sectional view of the semiconductor device shown in FIG. 4, further transformed using a process step defined in the present invention.

FIG. 5 shows the structure of FIG. 4 further modified by the additional step disclosed below whereby a silicon nitride film 32 is formed on the surface of the entire semiconductor integrated circuit in a thickness of 100–300 Å by low pressure chemical vapor deposition (LPCVD) or the like.

Figure 6:
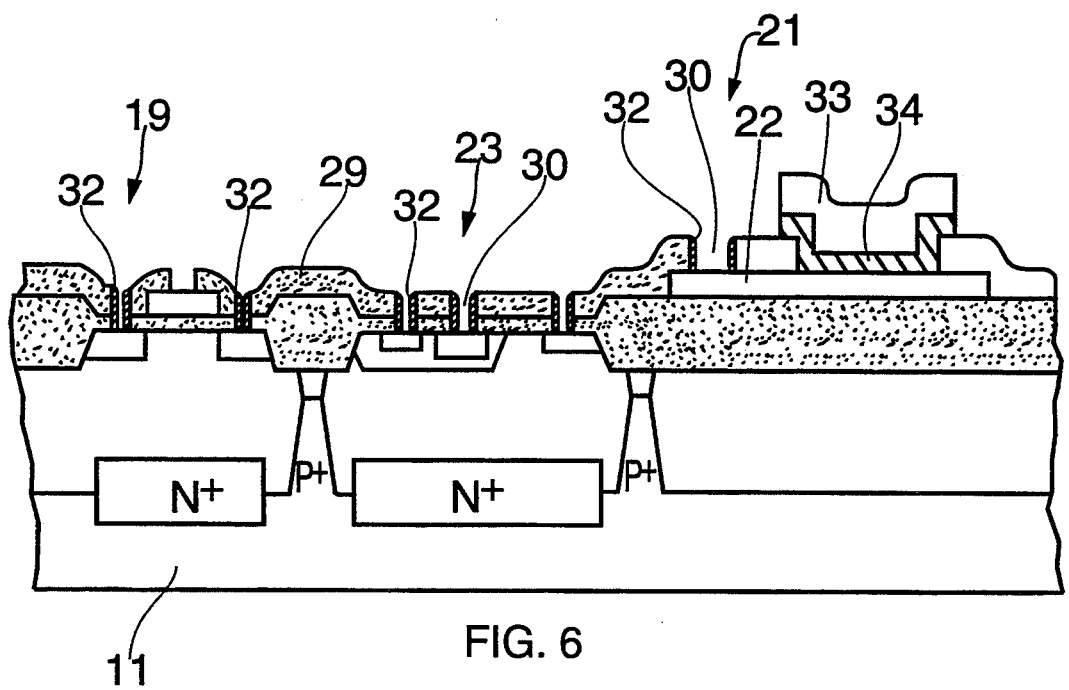
FIG. 6 is a sectional view of the semiconductor device shown in FIG. 5, further transformed using a process step defined in the present invention.

FIG. 6 shows the structure of FIG. 5 further modified by the additional step disclosed below whereby silicon nitride film 32 is selectively removed from most surfaces and a dielectric thin film 34 is selectively formed on most surfaces of the semiconductor integrated circuit.

First, a photoresist 33 for masking is formed on the area of silicon nitride film 32 region covering exposure 31 of capacitor element 21. A dielectric thin film 34 of capacitor element 21 is then formed on exposure 31. This can be performed by removing silicon nitride film 32 by anisotropic dry etching (CF4+O2) or the like whereby dielectric thin film of capacitor element 21 is formed on exposure 31.

This process is also available to form the opening of contact hole 30 simultaneously, if the etching is applied according to the following. Silicon nitride film 32 in contact hole 30 is removed by the above-mentioned anisotropic dry etching in order to form electrodes. Because of the characteristics of anisotropic dry etching and the geometry of contact holes 30, silicon nitride film 32 is not removed from the inside walls of all contact holes 30. This is shown especially clearly in FIG. 6 in the contact hole 30 region of capacitor element 21.

FIG. 7 shows the structure of FIG. 6 further modified by the additional step disclosed below whereby the electrode wiring is formed.

Metal wiring 35 is made to contact holes 30 above p+-type source and p+-type drain region 28, the diffusion regions of p-channel MOSFET 19', above n+-type emitter region 25, p+-type base contact region 26 and n+-type collector contact region 27, the diffusion regions of bipolar transistor 23. Metal electrode 37 is connected to lower electrode 22. Also, metal wiring is connected to upper electrode 36 of capacitor element 21.

The process for forming metal wiring 35 and metal electrode** 37 is as follows. First, the entire surface of the semiconductor integrated surface is coated with layers of Al or Al—Si. Then the coating is removed by a photo etching process from all of the surface areas where it is not desired.

Formation of semiconductor integrated circuits using the above-described method provides certain structural features not found in prior art formation processes.

The series resistance of the upper electrode 36 electrode is decreased by using a multiple layer wiring material such as Poly-Si. A decrease in series resistance not only decreases the power consumption in charging the capacitance in dielectric thin film 34 within capacitor element 21, but it also decreases the charge time by allowing more current to flow. Furthermore, since capacitor element 21 is arranged on LOCOS film 17, parasitic effects within the transistor are completely prevented. No parasitic leakage current to substrate 11 occurs nor are parasitic capacitances formed within the device.

Further, the present invention has the advantage that it is possible to attach capacitor element 21 easily as an optional device since capacitor element 21 is formed by using gate electrode 22 and metal electrode 37 material.

Forming of capacitor element 21 is optionally available by the process of the above-described invention because dielectric thin film 34 is formed on lower electrode 22 after the other devices, such as NPN transistor 23 or MOS transistor 19, are formed thereon.

Also, the contact process can be further simplified. Contact hole 30 and exposure 31 of capacitor element 21 are formed simultaneously. Because silicon nitride film 32 is formed on contact hole 30 in layers by the photo etching process, removal of the silicon nitride film and formation of dielectric thin film 34 may be done during the same process so that the number of masks required is at a minimum. This simplifies the process. Furthermore, when BPSG film 29 is applied using a planarization technique, i.e., a process by which BPSG film 29 is reflowed after the photo etching of dielectric thin film 34, the silicon nitride film 32 remaining at the side wall of contact hole 30 prevents the deformation of the shape of contact hole 30. In this manner it is possible to obtain a fine contact hole 30. Lastly, since the etching operation does not influence the surface of dielectric thin film 34, the thickness of dielectric thin film 34 is stable and easily controlled.

Having described preferred embodiments of the invention with reference to the accompanying drawings, it is to be understood that the invention is not limited to those precise embodiments, and that various changes and modifications may be affected therein by one skilled in the art without departing from the scope or spirit of the invention as defined in the appended claims.

What is claimed is:

1. A process for fabricating a semiconductor integrated circuit, comprising:
    forming an oxide film area on a semiconductor substrate by local oxidation of silicon;
    forming a first oxide film on at least first, second, and third elements of said substrate;
    forming a gate electrode on said first oxide film above said first element;
    forming a lower electrode on said first oxide film above said second element;
    coating a second oxide film on said gate electrode and said lower electrode;
    forming simultaneously at least three contact holes to expose a surface of a diffusion region of said first and second elements and a surface of said lower electrode and an opening to expose a substantial part of a surface of said lower electrode;
    forming a dielectric film on the resulting surface of said circuit;
    coating a resist pattern over said opening of said lower electrode; removing said dielectric film from said at least three contact holes;
    coating an electrode material on the resulting surface of said circuit;
    forming an upper electrode upon a portion of said dielectric film;
    forming a first electrode contacting said lower electrode through said contact hole which exposes the surface of said lower electrode; and
    forming a set of electrodes contacting each of said diffusion regions.

2. The process for fabricating a semiconductor integrated circuit recited in claim 1 wherein said dielectric film is a silicon nitride film.

3. The process for fabricating semiconductor integrated circuit recited in claim 1 wherein said second oxide film is a boron phosphorous silicate glass film.

4. A process for fabricating a semiconductor integrated circuit, comprising:
    providing a monocrystalline silicon body having a bipolar region, a MOS region and a capacitor region;
    oxidizing a top surface portion of said body to form an oxide film area;
    forming a gate oxide film on said oxide film area above said MOS region;
    forming a gate electrode on said gale oxide film;
    forming a lower electrode on said oxide film area above said capacitor region;
    coating an oxide film on the resulting surface of said circuit;
    simultaneously creating a plurality of contact holes to expose selected portions of said body and selected portions of said lower electrode;
    forming a first dielectric film over the resulting surface of said circuit;
    coating a resist pattern over one of said selected portion of said lower electrode;
    subsequently removing said first dielectric film from the exposed plurality of contact holes, wherein a portion of said first dielectric remains to form a second dielectric film over said selected portion of said lower electrode;
    forming an upper electrode upon a portion of said second dielectric film;
    forming a first electrode from said electrode material contacting said selected portion of said lower electrode; and
    forming second electrodes from said electrode material contacting each of said diffusion regions.

5. The process for fabricating a semiconductor integrated circuit recited in claim 4 wherein said first dielectric film is a silicon nitride film.

6. The process for fabricating semiconductor integrated circuit recited in claim 4 wherein said oxide film is a boron phosphorous silicate glass film.

7. The process for fabricating semiconductor integrated circuit recited in claim 4 wherein the steps of forming said gate electrode and forming said lower electrode occur simultaneously.

8. The process for fabricating semiconductor integrated circuit recited in claim 4 wherein the steps of forming said upper electrode, forming said first electrode and forming said second electrode occur simultaneously.

* * * * *